(12) United States Patent
Hoppe et al.

(10) Patent No.: US 6,737,939 B2
(45) Date of Patent: May 18, 2004

(54) CARBON NANOTUBE ARRAY RF FILTER

(75) Inventors: Daniel J. Hoppe, La Cañada, CA (US);
Brian D. Hunt, La Cresenta, CA (US);
Flavio Noca, Altadena, CA (US);
Jingming Xu, Providence, RI (US);
Larry Epp, Pasadena, CA (US);
Michael E. Hoenk, Valencia, CA (US)

(73) Assignees: California Institute of Technology,
Pasadena, CA (US); Brown University Research Foundation, Providence, RI (US)

(*) Notice: Subject to any disclaimer, the term of this patent is extended or adjusted under 35 U.S.C. 154(b) by 0 days.

(21) Appl. No.: 10/113,250

(22) Filed: Apr. 1, 2002

(65) Prior Publication Data

US 2002/0167375 A1 Nov. 14, 2002

Related U.S. Application Data

(60) Provisional application No. 60/280,396, filed on Mar. 30, 2001.

(51) Int. Cl.[7] .............................. H03H 9/00; H03H 9/46; H03H 9/70; D01F 9/12
(52) U.S. Cl. ....................... 333/186; 333/197; 333/133; 310/309; 205/768; 423/447.3
(58) Field of Search ................................. 333/186, 197, 333/133; 205/766, 768; 423/447.3; 310/309

(56) References Cited

U.S. PATENT DOCUMENTS

| | | | |
|---|---|---|---|
| 5,110,339 A | 5/1992 | Ciriello et al. ............... 65/238 |
| 5,617,020 A | 4/1997 | Campbell et al. | |
| 5,837,115 A | 11/1998 | Austin et al. ............... 204/450 |
| 6,146,227 A | * 11/2000 | Mancevski ................ 445/24 |
| 6,232,706 B1 | * 5/2001 | Dai et al. .................. 313/309 |
| 6,278,231 B1 | * 8/2001 | Iwasaki et al. ........... 313/310 |
| 6,346,189 B1 | * 2/2002 | Dai et al. ................... 205/766 |
| 6,361,861 B2 | * 3/2002 | Gao et al. ................ 428/367 |
| 6,399,406 B2 | * 6/2002 | Chan et al. ............... 438/28 |
| 6,401,526 B1 | * 6/2002 | Dai et al. .................. 73/105 |
| 6,440,761 B1 | * 8/2002 | Choi ......................... 438/20 |

FOREIGN PATENT DOCUMENTS

| | | | |
|---|---|---|---|
| DE | 101 104 68 | * | 9/2002 |
| JP | 6-310976 | * | 11/1994 |

OTHER PUBLICATIONS

International Search Report dated Jul. 10, 2002 for corresponding International Application No. PCT/US02/10204, 4 pgs.

Avrutsky, Ivan A. et al.; *Multiwavelength Diffraction and Apodization Using Binary Superimposed Gratings*; IEEE Photonics Technology Letters; vol. 10, No. 6, Jun. 1998; pp. 839–841.

Baughman, Ray H. et al.; *Carbon Nanotube Actuators*; Science; vol. 284; May 21, 1999; pp. 1340–1344.

Boul, P.J. et al.; *Reversible sidewall functionalization of buckytubes*; Chemical Physics Letters; vol. 310; Sep. 3, 1999; pp. 367–372.

(List continued on next page.)

*Primary Examiner*—Barbara Summons
(74) *Attorney, Agent, or Firm*—Christie, Parker & Hale, LLP

(57) ABSTRACT

A tunable nanomechanical resonator system comprising an array of nanofeatures, such as nanotubes, where the nanofeatures are in signal communication with means for inducing a difference in charge density in the nanofeature such that the mechanical resonant frequency of the nanofeature can be tuned, and where the nanofeature is in signal communication with a waveguide or other RF bias conduit such that an RF signal having a frequency corresponding to the mechanical resonant frequency of the array will couple to the array thereby inducing resonant motion in the array of nanofeatures, and subsequently coupling to an output waveguide, forming a nanoscale RF filter is provided. A method of producing a nanoscale RF filter structure controllably positioned and oriented with a waveguide and integrated electrodes is also provided.

53 Claims, 7 Drawing Sheets

OTHER PUBLICATIONS

Chen, Yan et al.; *Plasma–induced low–temperature growth of graphitic nanofibers on nickel substrates*; Journal of Crystal Growth; vol. 193; Jun. 5, 1998; pp. 342–346.

Choi, Young Chul et al.; *Growth of carbon nanotubes by microwave plasma–enhanced chemical vapor deposition at low temperature*; J. Vac. Sci. Technol., American Vacuum Society; vol. 18, No. 4; Jul./Aug. 2000; pp. 1864–1868.

Chou, Hou–Pu et al.; *A microfabricated device for sizing and sorting DNA molecules*; Proc. Natl. Acad. Sci. USA, Applied Physical Sciences, Biophysics; vol. 96; Jan. 1999; pp. 11–13.

Dial, O. et al.; *Fabrication of high–density nanostructures by electron beam lithography*; J. Vac. Sci. Technol.; vol. 16, No. 6; Nov./Dec. 1998; pp. 3887–3890.

Drmanac, R. et al.; *Sequencing by Hybridization*; Adams M.D. et al. "Automated DNA sequencing and analysis" Academic Press; pp. 29–36.

Duke, Thomas A. et al.; *Pulsed–field electrophoresis in microlithographic arrays*; Electrophoresis; vol. 17, 1996; pp. 1075–1079.

Duke, Thomas et al.; *Sequencing in nanofabricated arrays: A feasibility study*; Electrophoresis; 1997; vol. 18, pp. 17–22.

Fan, Shoushan et al.; *Self–Oriented Regular Arrays of Carbon Nanotubes and Their Field Emission Properties*; Science; vol. 283; Jan. 22, 1999; pp. 512–514.

Hadd, Andrew G. et al.; *Sub–microliter DNA sequencing for capillary array electrophoresis*; Journal of Chromatography A; vol. 894; 2000; pp. 191–201.

Hafner, Jason H. et al.; *Direct Growth of Single–Walled Carbon Nanotube Scanning Probe Microscopy Tips*; J. Am. Chem. Soc., The American Chemical Society; vol. 121; 1999; pp. 9750–9751.

Han, J. et al.; *Entropic Trapping and Escape of Long DNA Molecules at Submicron Size Constriction*; Physical Review Letters, The American Physical Society; vol. 83, No. 8; Aug. 23, 1999; pp. 1688–1691.

Han, Jie et al; *Observation and modeling of single–wall carbon nanotube bend junctions*; Physical Review B, The American Physical Society; vol. 57, No. 23; Jun. 15, 1998; pp. 983–989.

Han, Young–Soo et al.; *Synthesis of carbon nanotube bridges on patterned silicon wafers by selective lateral growth*; Journal of Applied Physics, American Institute of Physics; vol. 90, No. 11; Dec. 1, 2001; pp. 5731–5734.

Huang, Z.P. et al.; *Growth of highly oriented carbon nanotubes by plasma–enhanced hot filament chemical vapor deposition*; Applied Physics Letters, American Institute of Physics; vol. 73, No. 26; Dec. 28, 1998; pp. 3845–3847.

Hutt, Lester D. et al.; *Microfabricated Capillary Electrophoresis Amino Acid Chirality Analyzer for Extraterrestrial Exploration*; Analytical Chemistry; vol. 71, No. 18; Sep. 15, 1999; pp. 4000–4006.

Ilic, B. et al.; *Mechanical resonant immunospecific biological detector*; Applied Physics Letters, American Institute of Physics; vol. 77, No. 3; Jul. 17, 2000; pp. 450–452.

Ju, Jingyue et al.; *Energy transfer primers: A new fluorescence labeling paradigm for DNA sequencing and analysis*; Nature Medicine; vol. 2, No. 2; Feb. 1996; pp. 246–249.

Kelly, Ross T.; *Unidirectional rotary motion in a molecular system*; Nature; vol. 401; Sep. 9, 1999; pp. 150–152.

Kim, Philip et al.; *Nanotube Nanotweezers*; Science; vol. 286; Dec. 10, 1999; pp. 2148–2150.

Korgel, Brian A. et al.; *Self–Assembly of Silver Nanocrystals into Two–Dimensional Nanowire Arrays*; Advanced Materials; vol. 10, No. 9; 1998; pp. 661–665.

Koumura, Nagatoshi et al.; *Light–driven monodirectional molecular rotor*; Nature, vol. 401; Sep. 9, 1999; pp. 152–155.

Lee, Cheol Lin et al.; *Low–temperature growth of carbon nanotubes by thermal chemical vapor deposition using Pd, Cr, and Pt as co–catalyst*; Chemical Physics Letters; vol. 327; Sep. 15, 2000; pp. 277–283.

Li, Y.J. et al.; *Carbon nanotube films prepared by thermal chemical vapor deposition at low temperature for field emission applications*; Applied Physics Letters, American Institute of Physics; vol. 79, No. 11; Sep. 10, 2001; pp. 1670–1672.

Li, J. et al.; *Highly–ordered carbon nanotube arrays for electronics applications*; Applied Physics Letters, American Institute of Physics; vol. 75, No. 3; Jul. 19, 1999; pp. 367–369.

Liu, Q. et al.; *Detection of Virtually All Mutations–SSCP (DOVAM–S): A Rapid Method for Mutation Scanning with Virtually 100% Sensitity*; BioTechniques; vol. 26, No. 5; May 1999; pp. 932–942.

Masuda, Hideki et al.; *Highly ordered nanochannel–array architecture in anodic alumina*; Appl. Phys. Lett., American Institute of Physics; vol. 17, No. 19; Nov. 10, 1997; pp. 2770–2772.

Merkulov, V.I. et al.; *Patterned growth of individual and multiple vertically aligned carbon nanofibers*; Applied Physics Letters, American Institute of Physics; vol. 76, No. 24; Jun. 12, 2000, pp. 3555–3557.

Murakami, Hirohiko et al.; *Field emission from well–aligned, pattterned, carbon nanotube emitters*; Applied Physics Letters, American Institute of Physics; vol. 76, No. 13; Mar. 27, 2000; pp. 1776–1778.

Nakamura, S.; *InGaN–based violet laser diodes*; Semicond Sci. Technol.; vol. 14; Feb. 1999; pp. R27–R40.

Öttinger, Hans Christian; *A thermodynamically admissible reptation model for fast flows of entangled polymers*; The Society of Rheology, Inc.; J. Rheol; vol. 43, No. 6; Nov./Dec. 1999; pp. 1461–1493.

Poncharal, Philippe et al.; *Electrostatic Deflections and Electromechanical Resonances of Carbon Nanotubes*; Science; vol. 283; Mar. 5, 1999; pp. 1513–1516.

Ren, Z.F. et al.; *Growth of a single freestanding multiwall carbon nanotube on each nanonickel dot*; Applied Physics Letters, American Institute of Physics; vol. 75, No. 8; Aug. 23, 1999; pp. 1086–1088.

Reulet, B. et al.; *Acoustoelectric Effects in Carbon Nanotubes*; Physical Review Letters, The American Physical Society; vol. 58, No. 13, Sep. 25, 2000; pp. 2829–2832.

Roukes, M.L.; *Nanoelectromechanical Systems*; Technical Digest of the 2000 Solid–State Sensor and Actuator Workshop; pp. 1–10; Hilton Head, SC Jun. 4–8, 2000.

Routkevitch, Dmitri et al.; *Nonlithographic Nano–Wire Arrays: Fabrication, Physics, and Device Applications*; IEEE Transactions on Electron Devices; vol. 43, No. 10; Oct. 10, 1996; pp. 1646–1658.

Schmalzing, Dieter et al.; *Toward Real–World Sequencing by Microdevice Electrophoresis*; Genome Research; vol. 9; pp. 853–858, 1999, www.genome.org; Cold Spring Harbor Laboratory Press.

Soper, Steven A.; *Nanoliter–scale sample preparation methods directly coupled to polymethylmethacrylate–based microchips and gel–filled capillaries for the analysis of oligonucleotides*; Journal of Chromatography A; vol. 853; 1999; pp. 107–120.

Turner, S.W. et al.; *Monolithic nanofluid sieving structures for DNA manipulation*; J. Vac. Sci. Technol., American Vacuum Society; vol. 16, No. 6; Nov./Dec. 1998; pp. 3835–3840.

Van Der Gaag, B.P. et al.; *Microfabrication below 10 nm*; Appl. Phys. Lett, American Institute of Physics; vol. 56, No. 5; Jan. 29, 1990; pp. 481–483.

Volkmuth, W.D. et al.; *DNA Electrodiffusion in a 2D Array of Posts*; Physical Review Letters, The American Physical Society; vol. 72, No. 13; Mar. 28, 1994; pp. 2117–2120.

Volkmuth, W.D. et al.; *DNA electrophoresis in microlithographic arrays*; Nature; vol. 358; Aug. 13, 1992; pp. 600–602.

Westermeier, Reiner; *Electrophoresis in Practice, A Guide to Method and Applications of DNA and Protein Separations, Chapter I—Electrophoresis*; Second Edition; VCH, A Wiley company; 1997; pp. 6–39.

Wildöer, Jeroen W.G. et al.; *Electronic structure of atomically resolved carbon nanotubes*; Nature; vol. 391; Jan. 1, 1998; pp. 59–62.

Xu, Yan; Capillary Electrophoresis; Analytical Chemistry, American Chemical Society; vol. 71, No. 12; Jun. 15, 1999; pp. 309R–313R.

Yoon, Dy et al.; *Comparison of chain conformations for ploystyrene and model molecules in the gas phase, solvents and melts from MD simulations*; Abstracts of Papers, Part 2; $215^{th}$ ACS National Meetings; American Chemical Society; Mar. 29–Apr. 2, 1998; 1 p.

Yu, Min–Feng et al.; *Tensile Loading of Ropes of Single Wall Carbon Nanotubes and their Mechanical Properties*; Physical Review Letters, The American Physical Society; vol. 84, No. 24; Jun. 12, 2000; pp. 5552–5555.

Zhang, Y. et al., *Elastic Response of Carbon Nanotube Bundles to Visible Light*; Physical Review Letters, The American Physical Society; vol. 82, No. 17; Apr. 26, 1999; pp. 3472–3475.

Zhang, Yeugang et al., *Electric–field–directed growth of aligned single–walled carbon nanotubes*; Applied Physics Letters, American Institute of Physics; vol. 79, No. 19; Nov. 5, 2001; pp. 3155–3157.

Zhang, Y et al.; *Formation of single–wall carbon nanotubes by laser ablation of fullerenes at low temperature*; Applied Physics Letters, American Institute of Physics; vol. 75, No. 20; Nov. 15, 1999; pp. 3087–3089.

\* cited by examiner

Carbon nanotube array. J.Xu et al.

CARBON NANOTUBE ARRAY RF FILTER

CROSS-REFERENCE TO RELATED APPLICATION

This application is based on U.S. Application No. 60/280,396, filed Mar. 30, 2001, the disclosure of which is incorporated herein by reference.

STATEMENT REGARDING FEDERALLY SPONSORED RESEARCH

The U.S. Government has certain rights in this invention pursuant to grant No. NAS 7-1407, awarded by the National Aeronautics and Space Administration, Office of Space Science.

FIELD OF THE INVENTION

The present invention is directed to an array of nanoresonators, and more particularly to an array of carbon nanotube resonators for use as a tunable RF filter.

BACKGROUND OF THE INVENTION

Nanoscale structures are becoming increasingly important because they provide the basis for devices with dramatically reduced power and mass, while simultaneously having enhanced capabilities.

For example, mechanical resonators have been of significant interest because such resonators can exhibit orders of magnitude higher quality factors (Q) than electronic resonators. Such low-loss resonators are important for communications and mechanical signal processing applications. However, practical mechanical resonators have typically used bulk acoustic wave (BAW) oscillators, such as quartz crystals; or surface acoustic wave (SAW) oscillators. These bulk-crystal-based oscillators tend to be bulky and difficult to inexpensively integrate with high frequency electronic circuits. As a result, there has been a move towards Si-micromachined resonators, which can be monolithically integrated with conventional electronics. However, to date Si-based resonators have not been demonstrated at frequencies over 400 MHz, they suffer from reduced quality factors at higher frequencies, and they have limited tuning ranges. In addition, it appears that practical transduction mechanisms for the readout of Si resonators will be problematic for Si oscillators operating at or near the GHz frequency regime. Finally, data suggests that Si resonators will have a small dynamic range.

In contrast, nanoscale mechanical structures hold the potential to enable the fabrication of high-quality-factor (Q) mechanical resonators with high mechanical responsivity over a wide dynamic range. Such devices can form very low-loss, low-phase-noise oscillators for filters, local oscillators, and other signal processing applications. High-Q resonators are critical components in communications and radar systems, as well as in MEMS-based sensors such as a micro-gyroscope. The combination of high-Q with small force constants enabled by nanoscale resonators would also produce oscillators with exceptional force sensitivity. This sensitivity is important for a variety of force-detection-based sensors and may ultimately allow single molecule spectroscopy by NMR and optical techniques. (M. L. Roukes, Solid-State Sensor and Actuator Workshop Proceedings, Hilton Head, S.C., Jun. 4–8, 2000, p. 367.) Such mechanical oscillators are also key components for mechanical signal processing, which is of great interest because small-scale, high-Q mechanical elements may theoretically enable processing at GHz rates with orders-of-magnitude lower power dissipation than conventional CMOS processors. Arrays of nanoscale oscillators are of special interest because such arrays can store more energy than individual nanoresonators and so hold out the possibility of controlling and processing RF signals with significant power levels, as required for many practical communication and radar applications.

Despite the potential for these nanomechanical devices, the practical application of nanotube-based actuators and oscillators has been limited by the development of growth and processing methods for the control of nanotube placement and orientation. These techniques are critical for a wide variety of other nanotube applications including nanotube electronic systems.

One novel approach to making nanometer-scale structures utilizes self-assembly of atoms and molecules to build up functional structures. In self-assembled processing, atom positions are determined by fundamental physical constraints such as bond lengths and angles, as well as atom-to-atom interactions with other atoms in the vicinity of the site being occupied. Essentially, self-assembly uses the principles of synthetic chemistry and biology to grow complex structures from a set of basic feedstocks. Utilizing such techniques molecular motors have been synthetically produced containing fewer than 80 atoms. Chemical vapor deposition (CVD) appears to be the most suitable method for nanotube production for sensor and electronic applications. CVD uses a carbon-containing gas such as methane, which is decomposed at a hot substrate surface (typically 600–900 C) coated with a thin catalyst film such as Ni or Co. However, most studies to date have produced disordered nanotube films.

A notable exception is the work of Prof. Xu of Brown University who has developed a new technique for producing geometrically regular nanotube arrays with excellent uniformity in nanopore templates. Xu et al. *Appl. Phys. Lett.,* 75, 367 (1999), incorporated herein by reference. Post-patterning of these ordered arrays could be used to selectively remove tubes in certain areas or produce regions with different length tubes. A variety of other studies have shown that dense, but locally disordered arrays of normally-oriented nanotubes can be selectively grown on pre-patterned catalyst layers.

In addition, there has been little progress in the control of nanotube orientation in the plane parallel to the substrate surface. Many of the basic electrical measurements of nanotubes have been done using electrodes placed on randomly scattered tubes after growth, or by physically manipulating tubes into place with an atomic force microscope (AFM). Dai and co-workers have been able to demonstrate random in-plane growth between closely spaced catalyst pads, including growth over trenches, as well as a related technique to produce nanotubes suspended between Si posts. Dai. Et al., *Science,* 283, 512 (1999), incorporated herein by reference. In these cases individual nanotubes sometimes contact adjacent electrodes by chance, and excess tubes can be removed with an AFM tip. This type of procedure can be effective for simple electrical measurements, but considerable improvements will be required for production of more complex nanotube circuits. Smalley's group has demonstrated a wet chemistry-based method of control over nanotube placement using solution deposition on chemically functionalized substrates, although questions remain about nanotube length control and contact resistance. Smalley et al., *Nature,* 391, 59 (1998), incorporated herein by reference. More recently, Han and co-workers have demonstrated a process for lateral growth of nanotubes between two electrodes, but with uncontrolled nanotube location and orientation in the plane of the substrate (Han et al., Journal of Applied Physics 90, 5731 (2001)). None of the current techniques have been able to grow vertical individual nanotubes or small groups of nanotubes in controlled locations with integrated electrodes, as would be necessary to form nanotube oscillators or actuators.

At least one group has been able to produce vertical carbon nanofibers (V. Merkulov et al., Appl. Phys. Lett. 76, 3555 (2000)), but such nanofibers do not have the ideal graphite-like hollow tube structure of carbon nanotubes. Instead, the fibers exhibit a highly disordered "bamboo" structure and will therefore have inferior surface and mechanical propoerties and be more suscpetible to losses that degrade resonator quality factors.

In addition to the problems associated with controlled growth and orientation of nanotubes, nanotube actuators and oscillators also require a transduction mechanism to convert input signals to physical motion and to provide corresponding output signals.

One possible electromechanical transduction mechanism is suggested by a recent demonstration that nanotube mats can serve as very high efficiency electromechanical actuators in an electrolyte solution, with the possibility of even better results for well-ordered single wall tubes. Baughman et al., Science, 284 1340 (1999), incorporated herein by reference. In brief, Baughman found that electronic charge injection into nanotubes results in a change in the length of the nanotubes. Conversely, it is expected that changing the length of a nanotube through an externally-applied force will result in the movement of charge on or off the tube, depending on whether the tube is stretched or compressed. However, this technique has only been demonstrated for large disordered arrays of nanotubes. Other potential actuation mechanisms include Coulomb force (electric field force on charges) interaction and light-induced nanotube motion. However, it is expected that light coupling to nanoscale-cross-section nanotubes will be inefficient.

There has been one report of high frequency resonator measurements on carbon nanotube bundles suspended over a trench in which Qs of around 1000 at 2 GHz were observed. (B. Reulet et al., "Acoustoelectric Effects in Carbon Nanotubes," Phys. Rev. Lett. 85: 2829–2832 (2000)). In this case, Coulomb force coupling to a nonintegrated macroscopic local antenna was used to drive the mechanical resonance of the individual suspended nanotube bundle. However, the carbon bundle resonator required superconducting electrodes and low temperature measurement. Furthermore, the individual nanotube resonator is not suitable for RF power handling operation because the vibrational mode of such a device can store and transmit very little energy.

Accordingly, a need exists to develop nanoscale mechanical devices, such as, resonators to enable real-world applications ranging from molecular-scale characterization to ultra-low-loss mechanical filters and local oscillators for communications and radar, to rad-hard low-power mechanical signal processors.

SUMMARY OF THE INVENTION

The present invention is directed to a tunable nanomechanical resonator system comprising an array of nanofeatures, such as nanotubes, where the nanofeatures are in signal communication with means for inducing a difference in charge density in the nanofeature (e.g. by biasing one end of the feature) such that the resonant frequency of the nanofeature can be tuned, and where the nanofeature is in signal communication with a waveguide or other RF bias conduit such that an RF signal having a frequency corresponding to the mechanical resonant frequency of the array will couple to the array thereby inducing resonant motion in the array of nanofeatures, which in turn couples to an RF output waveguide structure, forming a nanoscale RF filter. The invention is also directed to growth techniques capable of producing a nanoscale RF filter structure controllably positioned and oriented with a waveguide and integrated electrodes.

In one embodiment, this invention utilizes an array of carbon nanotubes with an integrated electrode on a substrate that functions as an RF filter. This invention is also directed to a device, which utilizes multiple arrays of carbon nanotubes with integrated waveguides and electrodes that functions as an RF filter bank. This invention is also directed to novel systems and methods for utilizing devices comprising at least one array of nanotubes with an integrated waveguide and electrode.

In another alternative embodiment, the nanotube array oscillation is produced by optical irradiation or by direct RF coupling to the array via base and top electrodes.

In still yet another embodiment, the invention is directed to growth and processing techniques to control array location and orientation; and methods for positioning nanotubes during growth, including nanoscale patterning of the substrate to ensure that the growth of the nanotubes is ordered and oriented properly with the waveguide and integrated electrodes.

In still yet another embodiment the nanotubes comprising the arrays are self-assemble into arrays in which each nanotube has a specified diameter and height suitable for use in the devices of the current invention.

In still yet another embodiment, the substrate is made of a semiconductor such as, for example, oxidized silicon or aluminum oxide, coated with a metal catalyst film such as, for example, Ni or Co. In this embodiment, the silicon can be further doped to adjust the electronic properties of the substrate surface.

In still yet another embodiment, the nanotubes comprising the arrays are self-assembled from an inert material such as, for example, carbon utilizing a carbon feedstock gas such as, for example, ethylene.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION OF THE INVENTION

The present invention is directed to a tunable nanoscale RF filter device and system comprising at least one array of nanofeatures, such as a nanotubes, and means for inducing a charge in the tubes (e.g. by biasing the tube via a capacitively coupled electrical field) such that the resonant frequency of the nanotubes of the array can be tuned, and a waveguide for conducting an RF signal to the array, forming a nanoscale RF filter. These devices will be collectively referred to as nanofilters herein.

Figure 1A:
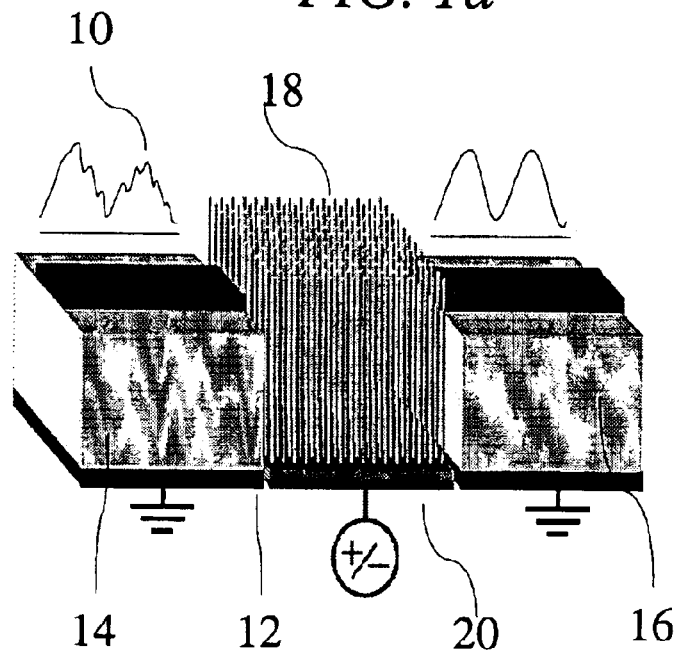
FIG. 1a is a schematic view of an embodiment of a vertically oriented nanoarray RF filter according to the invention.
Figure 1B:
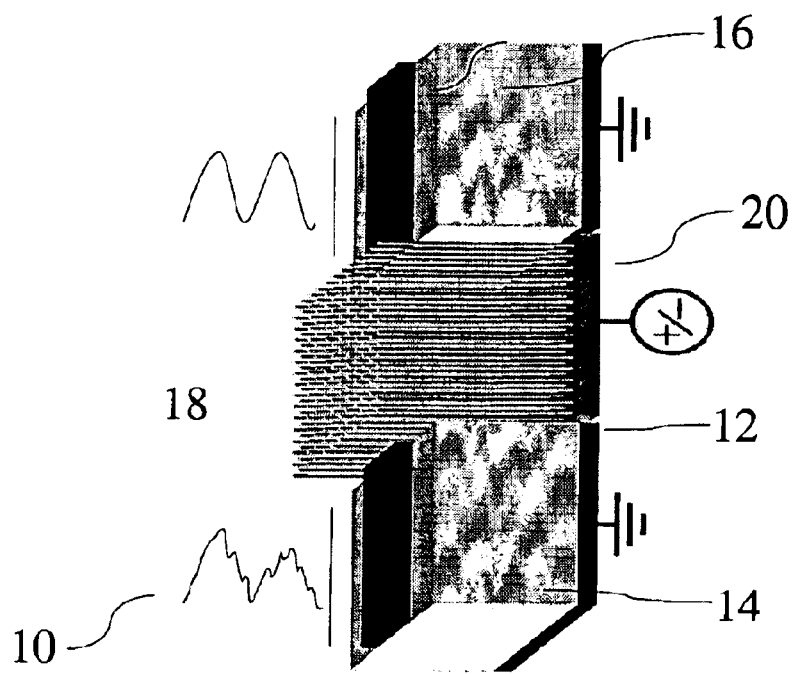
FIG. 1b is a schematic view of an embodiment of a horizontally oriented nanoarray RF filter according to the invention.

As shown in FIGS. 1a and 1b, in one embodiment the RF nanofilter device 10 according to the invention comprises a substrate 12, having first 14 and second 16 wave guides in signal communication with an array of nanofeatures 18 each nanofeature individually, and the array collectively, having a resonant frequency. The first and second waveguides being separated by the array of nanofeatures and the array of nanofeatures being in signal communicaton with an integrated electrode 20. The integrated electrode being in further communication with a tuning source designed to inject electric charge into the nanofeatures of the array to enable Coulomb force coupling between the waveguide electrodes and the tubes, as well as tube to tube coupling, and to tune the resonant frequency of the nanofeatures. As shown, the array of nanofeatures can be in either a vertical or horizontal alignment.

Although RF nanofilters having a single array of nanotubes rigidly fixed to an electrode plate between two waveguides are shown in FIGS. 1a and 1b, it should be understood that any suitable RF nanofilter capable of tuned oscillation may be utilized.

Regardless of the design, the RF nanofilter devices shown schematically in FIGS. 1a and 1b operate as an RF filter via an RF bias induced oscillation, shown schematically in FIGS. 1a and 1b. In the embodiment of the invention described above, the input bias to electrode 20 is used to adjust the frequency of oscillation. Because this bias controls the amount of charge stored in each tube, and the Coulomb forces between tubes scale with charge, this bias controls the strength of coupling within the array and can tune the mechanical resonant frequency of the array. In essence, increasing the bias on electrode 20 increases the tube-to-tube repulsion. Which has the effect of making the confined array stiffer with a higher resonant frequency. In addition, if a second nanotube-contacting electrode is added to the array, because the tube length depends on injected charge, a capacitively-coupled voltage bias from the tuning control source will control the stress on the rigidly anchored nanotubes, thereby allowing for the tuning of the nanotube's mechanical resonance frequency.

In addition to the low frequency tuning bias, discussed above, an incoming RF signal on the microstrip waveguide electrodes couples to the tubes via Coulomb forces between moving charges in the waveguide and charges on the tubes, thereby producing an oscillating deflection of the nanotube array. The nanotubes will vibrate in unison because the wavelengths at typical RF frequencies (100 MHz to 10 GHz) are much greater than the nanotube array dimensions.

The basic principle of operation of such an array as band-pass filter is excitation of a mechanical (acoustic) deformation of the nanotubes by an incident RF wave. Coupling between the RF signal and the nanotubes is provided by Coulomb forces on electric charges in the nanotubes. Incident RF waves traveling along the waveguide are reflected by the conducting nanotubes unless the incident wave is at the mechanical resonant frequency of the array. For incident RF waves that are at the resonant frequency of the array, the wave induces a mechanical resonance of the uniform nanotube array and couples the RF wave at the resonance frequency into the output waveguide, thereby filtering the incoming RF signal.

Although not to be bound by theory, the fundamental idea behind the waveguide-embedded array is that the conducting nanotubes act to reflect the incident RF power at all frequencies except the nanotube mechanical resonant frequency, $f_o$. At $f_o$ the incident RF wave couples to nanotubes adjacent to the input microstrip electrode due to Coulomb forces between the RF electric field and electric charge on the tubes. The charge on the nanotubes can be induced by the applied field, or by charge transfer between the tubes and the base electrode. The vibration of the excited tubes adjacent to the input electrode then couples to nearby tubes via electric forces so that an acoustic excitation of the entire array becomes possible. Finally, RF energy can be coupled out of the vibrating nanotubes via Coulomb forces between the tubes and free charges in the output electrode/waveguide. Thus the nanotube array acts as a bandpass filter at $f_o$ with the passband width set by the Q of the resonator array.

Note that in the waveguide-embedded array device described here, coupling between the device input and the nanotubes occurs via electrostatic forces: Coulomb forces between the electrodes and the tubes excite a mechanical resonance in the tube array and couple this energy to the output. In this case the electric force can arise from induced dipoles in the tubes, or from excess charges on the nanotubes. Such charges can result from work function differences between the tubes and the base electrode (FIGS. 1a and 1b), or from a parallel voltage bias on the tubes. In fact, such a voltage bias provides some tunability in the array device by increasing the tube—tube repulsion ("the pressure") within the array. While the electrostatic coupling of the waveguide embedded array device is expected to be less efficient than direct charge injection transduction, the coherent motion of the array will improve the S/N ratio as well as allowing higher power levels to be handled.

Figure 2:
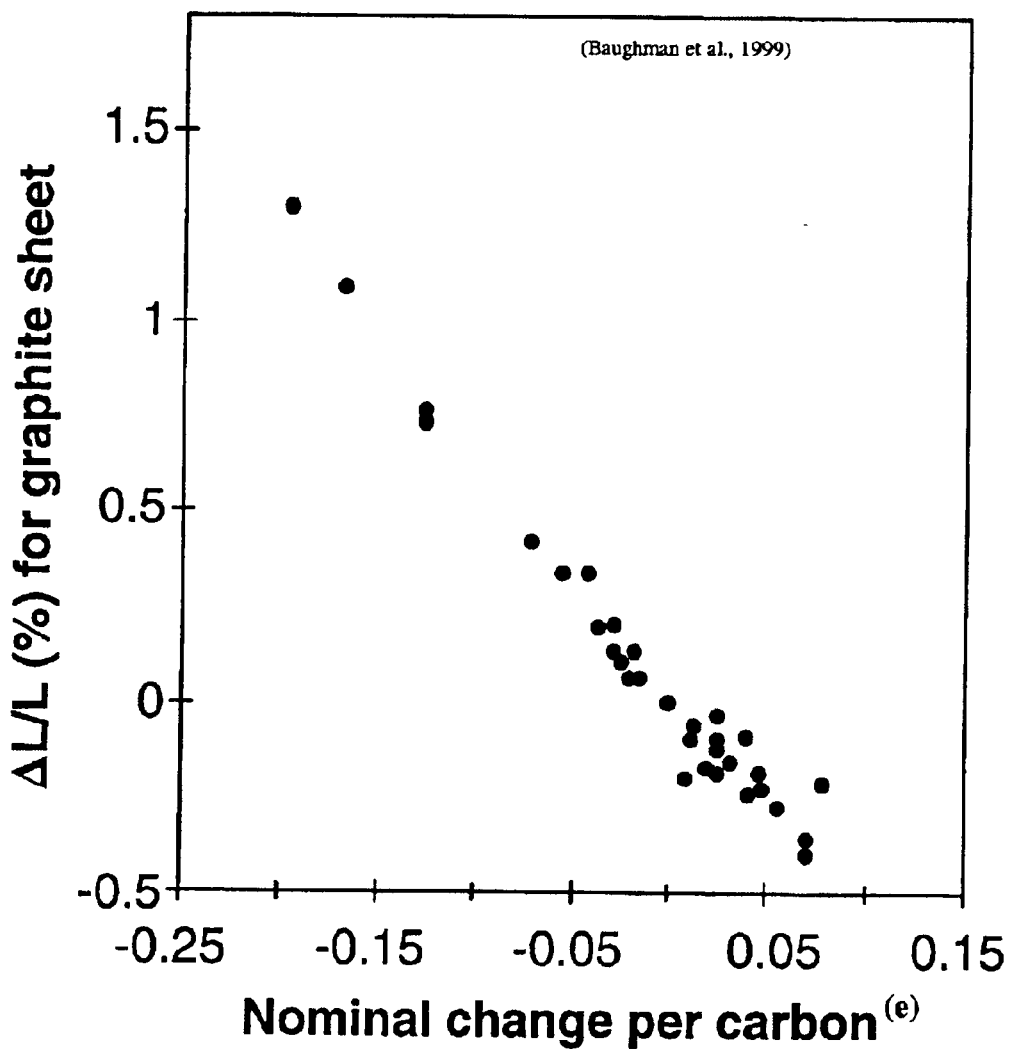
FIG. 2 is a graphical representation of the C—C bond length variation of graphite or carbon nanotubes. (Baughman et al., Science, 284, 1340 (1999)).

The charge induced motion discussed above has previously been observed in random arrays of carbon bimorph mats and in graphite sheets, see, e.g., R. Baughman, cited above, incorporated herein by reference. Data from the experiments showing this length verse charge variation is reproduced in FIG. 2. Although not to be bound by theory, it is believed that the nanotube length change is caused by "quantum chemical effects", that is, changes in orbital occupation and band structure result in changes in the C—C bond distances and thus the length of the nanotube. It should also be noted that the charge-induced transduction mechanism is symmetric, i.e., length changes in the nanotubes will induce charge transfers and hence voltages, providing a readout mechanism and/or positional sensor for both actuators and oscillators. Although the Baughman experiments were done in electrolytic solutions, it should be understood that no electrolytic solution is required so long as direct electrical contact is made with each nanotube. Alternatively, although the charge-induced actuation mechanisms shown in FIGS. 1 to 2 are only depicted in non-liquid environments, which are useful for high-Q resonator applications, it should be understood that the nanotube electromechanical transduction effect can be compatible with operation in liquids, such as for use in biological actuators.

Because the C—C bond length and therefore the overall tube length of each of the nanotubes of the array depends on the injected charge, a capacitively coupled dc bias can be used to control the stress of the nanotubes of the array. The work of Baughman et al., as reproduced in FIG. 2 suggests that voltage biases of only a few volts can produce nanotube strains of approximately 1 percent. In a device similar to that depicted in FIGS. 1a and 1b, such as the device shown in FIG. 6(D) where in the ends of the nanotubes of the array are rigidly anchored to both top and bottom electrodes, controlling the charge injection varies the stress on the tube and provides a straightforward method for tuning the mechanical resonant frequency, on the tube. This dual electrode geometry also provides an alternate transduction mechanism for coupling RF energy out of the nanotube array.

Any collection of nanofeatures suitable for use as an actuator/oscillator array may be utilized in the current invention. In a preferred embodiment, as shown in FIG. 1a and discussed above, a uniform carbon nanotube array is utilized. Carbon nanotubes possess a combination of properties that make them well suited for use as nano-resonators. For example, nanotubes combine a nanometer scale diameter with a large aspect ratio, good electrical conductivity, and elastic bending. Single-wall nanotubes also have a Young's modulus of approximately 1 TPa, which corresponds to strength/weight ratio approaching 200 times that of steel. The combination of this high Young's modulus and the ability to withstand large strains (~5%) suggests that SWNTs should also have very high breaking strengths.

In addition, the natural rigidity and structural perfection of the nanotubes, discussed above, indicates that the nanotube system according to the present invention should function as a high-Q mechanical resonator for many devices, such as, for example, filters, signal processors, and sensors. Since nanotubes naturally occur with nanoscale diameters, they are well suited for fabrication of oscillators with large aspect ratios and associated high responsivity. The lowest order resonant frequency for a nanotube cantilever is given by:

$$v_j = \frac{(1.875)^2}{8\pi} \frac{1}{L^2} \sqrt{D^2 + D_i^2} \sqrt{\frac{E_b}{\rho}} \quad (1)$$

where L is the length, D and $D_i$ are the outer and inner diameters, $E_b$ is the elastic modulus, and is the density (1.33 g/cm$^3$). For a cantilever with D=10 nm, $D_i$=8 nm, and 100 nm in length, this formula predicts a resonant frequency of approximately 4 GHz. This frequency more than doubles for a nanotube oscillator fixed on both ends as proposed in the current invention. Note that since nanotube lengths can be varied over the range of approximately 10 nm to 100 μm, it is possible to control resonant frequencies over 8 orders of magnitude.

Such nano-structures also exhibit extremely high quality factors, for example, Q values of mechanical oscillators range from $10^3$ to $10^9$, with values of $10^3$ to $10^5$ for nanoscale structures in vacuum. These Qs are much larger than typical quality factors for electronic resonant circuits, accordingly, mechanical resonators such as quartz crystal oscillators are used in communications systems. Because Q varies as 1/D, where D is the internal dissipation, high Q values correspond to low-loss system components. High quality factors also translate to exceptional oscillator stability and low phase noise. Such low-phase-noise local oscillators (LO) are critically important for narrow-bandwidth communications and sensitive doppler radars. For example, the LO phase noise sets the minimum detectable velocity for Doppler radar. In another embodiment, such high-Q oscillators could also be utilized as narrow-band, low-loss filters, and improve the stability and sensitivity of MEMS-based sensors such as a micro-gyroscope.

Moreover, by moving to nanoscale mechanical structures, it is possible to combine high Qs with high frequency operation and small force constants (high responsivity). Calculations indicate that Si mechanical oscillators with realistically achievable dimensions (0.1×0.01×0.01) have resonant frequencies of a few GHz. High resonant frequencies are important for producing mechanical signal processing components compatible with today's characteristic circuit clock rates. Resonators with nanoscale dimensions can achieve GHz resonant frequencies in structures with reasonably large aspect ratios, which translates directly to small force constants. The combination of high-Q with small force constants enabled by nanoscale resonators results in oscillators with exceptional force sensitivity.

The signal monitor system for measurement of the RF filter operation can comprise any suitable circuit or device capable of measuring the signal change from the detector and transmitting that information to the user, such as, for example, a printed circuit board having a pre-amplifier, an AD converter and driver circuit, and a programmable chip for instrumentation specific software; or a multichip module comprising those elements.

In another embodiment, the nanoscale oscillators discussed above may also be utilized in mechanical signal processing systems. Mechanical signal processing is of great interest because small-scale, high-Q mechanical elements theoretically enable processing at GHz rates with up to six orders of magnitude lower power dissipation than conventional CMOS processors of comparable complexity. In addition, such devices would be radiation tolerant, an important property for space-based applications. For example, an oscillator array according to the invention containing elements with controllably varying resonant frequencies could be utilized for high-speed Fourier signal processing.

Although as discussed above, an oscillator geometry comprising an array of vertically aligned carbon nanotubes with an electrical contact at one end of the nanotube is preferred, any array of nanofeature structures with an RF source capable of initiating an oscillation on the array may be utilized. For example, systematic variations of critical geometric factors may include the nanotube lengths and electrode attachment. Alternatively, arrays with more than two electrodes are also possible. For example, any spacing or pattern of nanotubes and electrodes may be utilized such that at least a portion of each of the nanotubes is free to vibrate, as shown in FIGS. 1a and 1b, and such that the resonant frequency of the vibratable portion of the nanotube is tunable.

The construction of an array of nanofeatures is important because single nanfeatures are not ideal as an RF power-handling device, primarily because the mechanical oscillation of an individual nanofeature cannot store much energy. Indeed, the minimum operating power levels of these nanomechanical resonators is estimated to be on the order of femtowatts. This ultralow power operation is extremely beneficial for certain applications, but high-density arrays of nanotubes are necessary to increase the power handling capability in some aapplications, such as microwave. However, the utilization of nanotube arrays imposes the additional constraint of nanotube uniformity, since resonant frequency scales as diameter/(length)$^2$.

Accordingly, this invention is also directed to a method of forming a highly uniform carbon nanotube array. Prof. Jimmy Xu at Brown University, has developed a nanopore-template technology for fabrication of dense nanotube arrays with better than 5% diameter uniformity. The uniformity of this Si-compatible process is far superior to that achieved in other approaches to nanotube array fabrication, and exceeds the perfection of conventional high resolution lithographic techniques at the size scale of interest here (10–30 nm diameters). Although only vertically arranged arrays of nanotubes are discussed below, other novel array fabrication techniques may also prove suitable for production of uniform nanotube arrays for the proposed RF filter device. A basic advantage of the vertically aligned array structure is that the vertically-oriented resonator geometry provides a highly area-efficient means of packing the nanotube oscillators, in contrast to membrane or in-plane resonator structures. It should also be understood that nonuniform nanotube arrays with controlled patterns of nanotube placement may be useful for more complex filtering and signal processing applications. Such controlled nonuniform nanotube arrays could be produced by electron beam lithography patterning of nanotube catalyst dots.

Returning to the structure of the underlying nanotube array system 10, shown in FIG. 1a, it should be understood that the substrate 12 can be made of any material which can withstand the temperatures required for growth of the nanotube array 18 and which can be modified to provide a suitable nucleation point for growing the nanotube array 18 on the electrode 20 between the two waveguides 14 and 16 of the nanomechanical device 10, such as, for example, metallized Si oxide wafers, other semiconductor substrates, anodized alumina, glass, or sapphire. In turn, any suitable electrode and catalyzing metal can be used for the electrode 20 and to activate the nucleation point on the surface of the substrate 12, such as, for example, nickel or cobalt. Alternatively, the catalyzing metal could be an alloy of two or more metals such as a Co/Ni or Ti/Ni alloys. The metal catalysts could also be produced by pyrolysis of inorganic or organic metal-containing compounds, such as, for example, Ferric Nitrate or Cobalt Chloride. Accordingly, in the limit of sub-50 nm catalyst dots, it is possible to nucleate growth of a single nanotube at a catalyst location. An integrated electrode 20 can be produced by combining the catalyst dots with non-catalytic electrodes. This ability to precisely locate and orient the growth of individual nanotubes provides the basis for fabrication of the controlled geometry nanotube arrays. Such a method may utilize an electron-beam lithography system. A refinement of the catalyst dot patterning process could include pre-etched pores in a substrate or electrode to contain and confine the catalyst material. In addition, the sidewalls of such pores would serve to direct the vertical growth of nanotubes growing op out of such pores.

Figure 3:
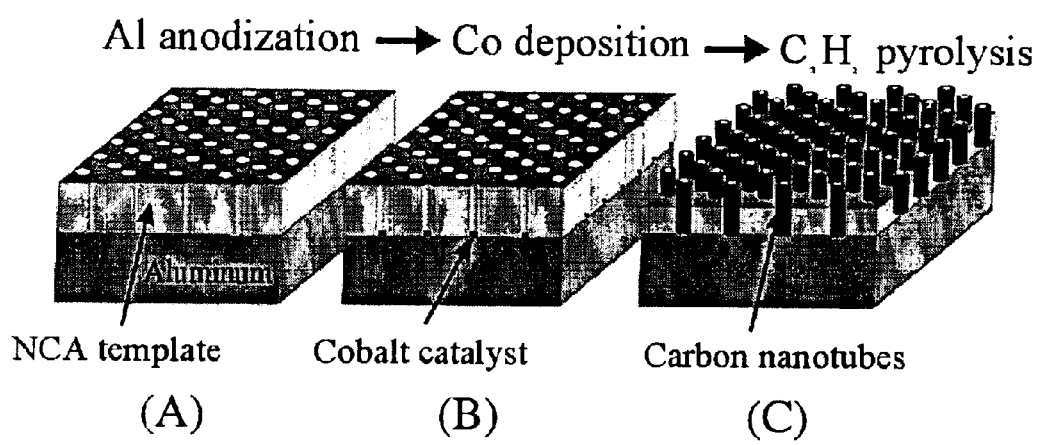
FIG. 3 is a schematic view of the nanopore alumina process used as a preferred technique for producing highly uniform carbon nanotube arrays. (J. Li, et al. Appl. Phys. Lett. 75, 367 (1999)).

A possible process for forming the nanofilter array 18 of the present invention comprising utilizing a chemical vapor deposition (CVD) technique is shown schematically in FIG. 3. In a first step a substrate 12, such as, for example, silicon is coated with a high purity metal film, such as, for example, Al. The metal is then anodized in a multistep process to produce germination points or pores in a highly ordered nanopore array in the metal oxide surface, as shown in FIG. 3(a). Next, a small amount of catalytic material, such as, for example, Co or Ni is electrochemically deposited in the bottom of the pores to serve as a catalyst for carbon nanotube nano-feature 18 growth, as shown in FIG. 3(b). Finally, as shown in FIG. 3(c), the array of nanotube nano-features 18 is self-assembled by pyrolysis of a suitable feedstock, such as, for example, acetylene gas diluted in nitrogen and/or ammonia at about 650 C and the array of nanotube nano-features 18 is then partially exposed by etching the metal oxide film in a mixture of phosphoric and chromic acids. The anodized surface and the catalyzed pores serve as a template such that the nanotube nano-features self-assemble in an ordered array 18 corresponding to the pores in the anodized metal substrate. A detailed description of this method for the self-assembled growth mechanism of a well-ordered self-assembled carbon nanotube array is found in, *Appl. Phys. Let.* vol. 75, 367 (1999), which is incorporated herein by reference.

Figure 4:
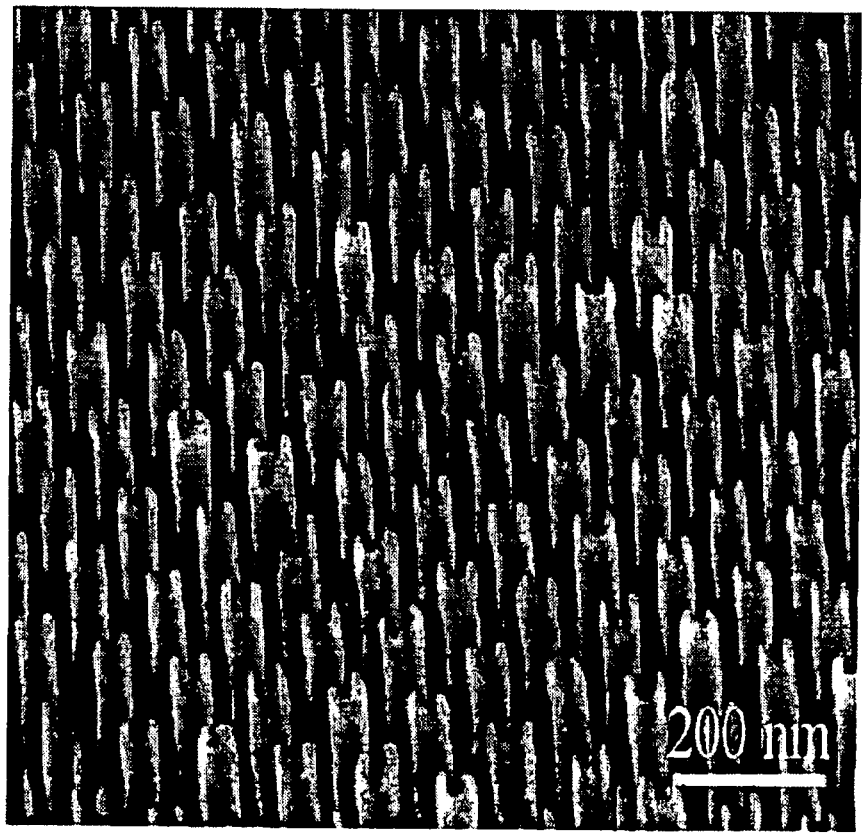
FIG. 4 is an SEM of the aligned growth of a carbon nanotube array.

FIG. 4 is an SEM micrograph of a self-assembled nano-array comprising nanotube nano-features produced by this process. As shown, utilizing this technique, nanotube nano-features of uniform length and cross-section and with only a 5% spread in diameter can be grown in very regular hexagonal arrays of parallel nanotubes. Moreover, the relatively low vapor deposition growth temperature makes the technique compatible with basic Si processes. Furthermore, because the pore diameter is proportional to the anodization voltage, the pore size can be controlled from 10 nm up to several hundred nm with nano-feature areal densities as high as $10^{11}$ cm$^2$. Voltage control of the nanochannel diameter also offers the possibility of optimizing the nano-feature diameter for different signal control functions.

Figure 5:
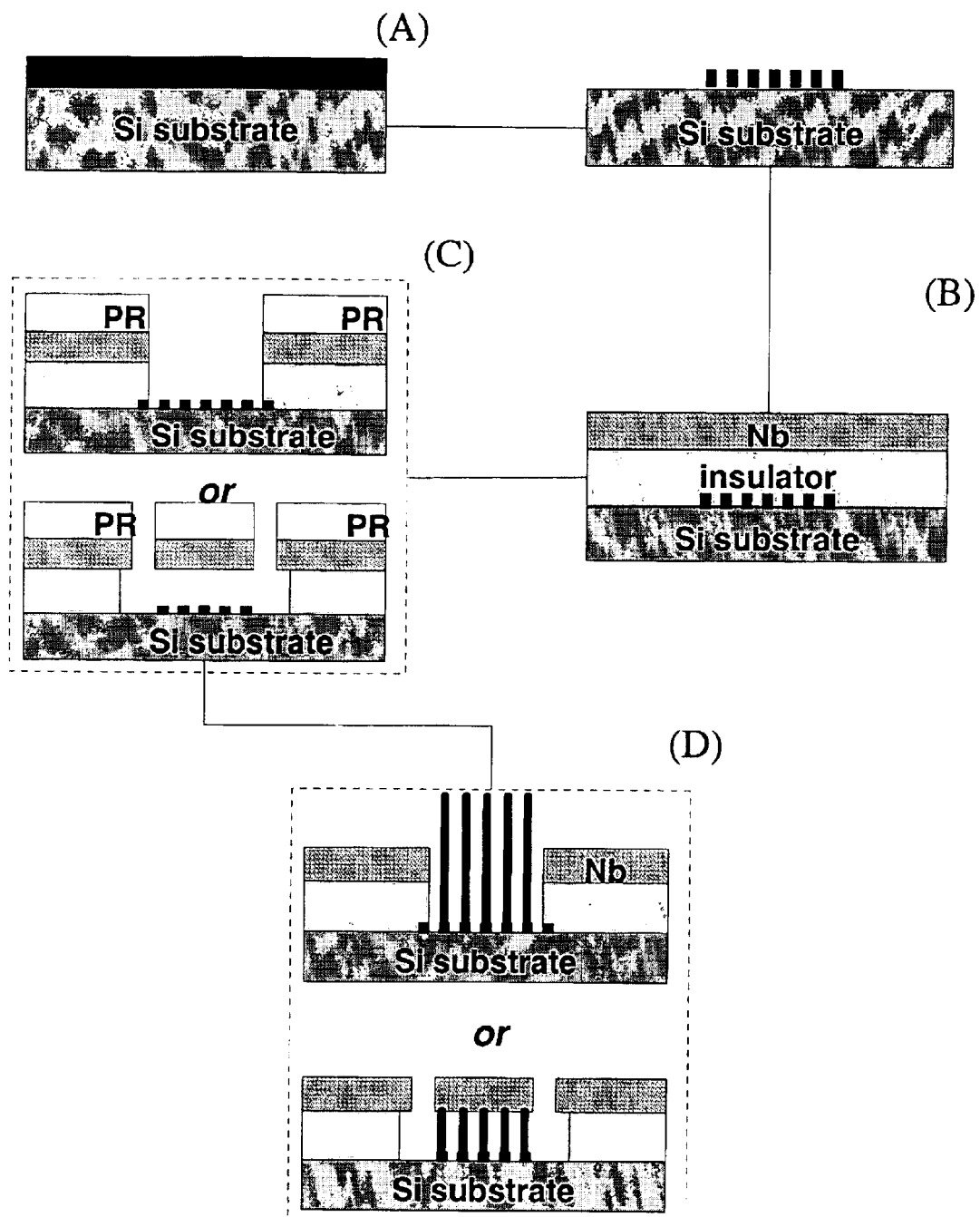
FIG. 5 is a schematic view of an embodiment of a process for forming a nanoarray RF filter according to the invention.

FIG. 5 shows an alternative technique to construct the nanotube array RF filter shown in FIG. 1a, which uses standard semiconductor processing methods to construct an array with integrated electrodes on a Si substrate. To ensure proper nanotube growth, the region of growth is coated with a thin catalyst film such as Ni, Co, or other metal-based mixtures or compounds to locally nucleate nanotube growth. The integrated electrodes are formed from a refractory metal/insulator bilayer compatible with the required high temperature nanotube growth conditions.

As shown in one basic embodiment, (FIG. 5), thin catalyst layer of a suitable metal is deposited on a Si substrate by sputtering, electron beam evaporation, or some other suitable technique (step A). Such a catalyst layer can create effective nucleation sites for nanotube growth due in part to the roughening of the catalyst morphology which occurs during heating to and at the nanotube growth temperature. As an optional step, it may also be desirable to pattern a catalyst layer on the Si substrate using electron beam and or photo-lithographic patterning combined with a liftoff or etching process. Patterning via self-ordering block copolymer films is also possible (M. Bronikowski and B. D. Hunt, "Regular arrays of carbon nanotubes produced using templates from nano-structured block-copolymeric materials", NASA New Technology Report, NPO-30240 (5/01)). As a further optional step, the patterned catalyst dots could be recessed in pre-etched pores in the Si substrate. Following catalyst deposition and optional patterning, an insulator/refractory metal bilayer is deposited over the catalyst, for example an SiO$_2$/Nb bilayer could be deposited by CVD and by sputtering for the respective layers (step B). Next a photoresist layer (PR) and/or e-beam resist layer is lithographically patterned and the pattern is transferred into the underlying Nb and SiO2 layers by a suitable combination of dry and/or wet etching steps (step C). The etching process is designed to avoid removing the catalyst layer, which is exposed after etching the insulator layer. In an alternative version of step C, the pattern is designed so that an undercutting insulator etching process (e.g. an HF solution etch of $SiO_2$) leaves a portion of the Nb film suspended above the catalyst region by supports at the side of this area.

Finally, once the electrode and insulator structures are defined, the nanotubes are grown on the catalyst layer by a CVD process to form a vertical array of tubes between the two waveguide structures (step D). In the case where a suspended metal electrode exists above the nanotube growth area, the nanotube length will be precisely controlled by the Si-to-electrode gap and the suspended electrode provides a top electrical contact for the nanotube array, which can be useful for alternate array readout schemes, as well as for tuning the array via a charge-injection-induced length change. The suspended electrode also provides a means for an optional electric field alignment of nanotubes during growth. The finished device shown in FIG. 5(D) uses the Si as a contacting base electrode to inject charge into the nanotube array.

Figure 6:
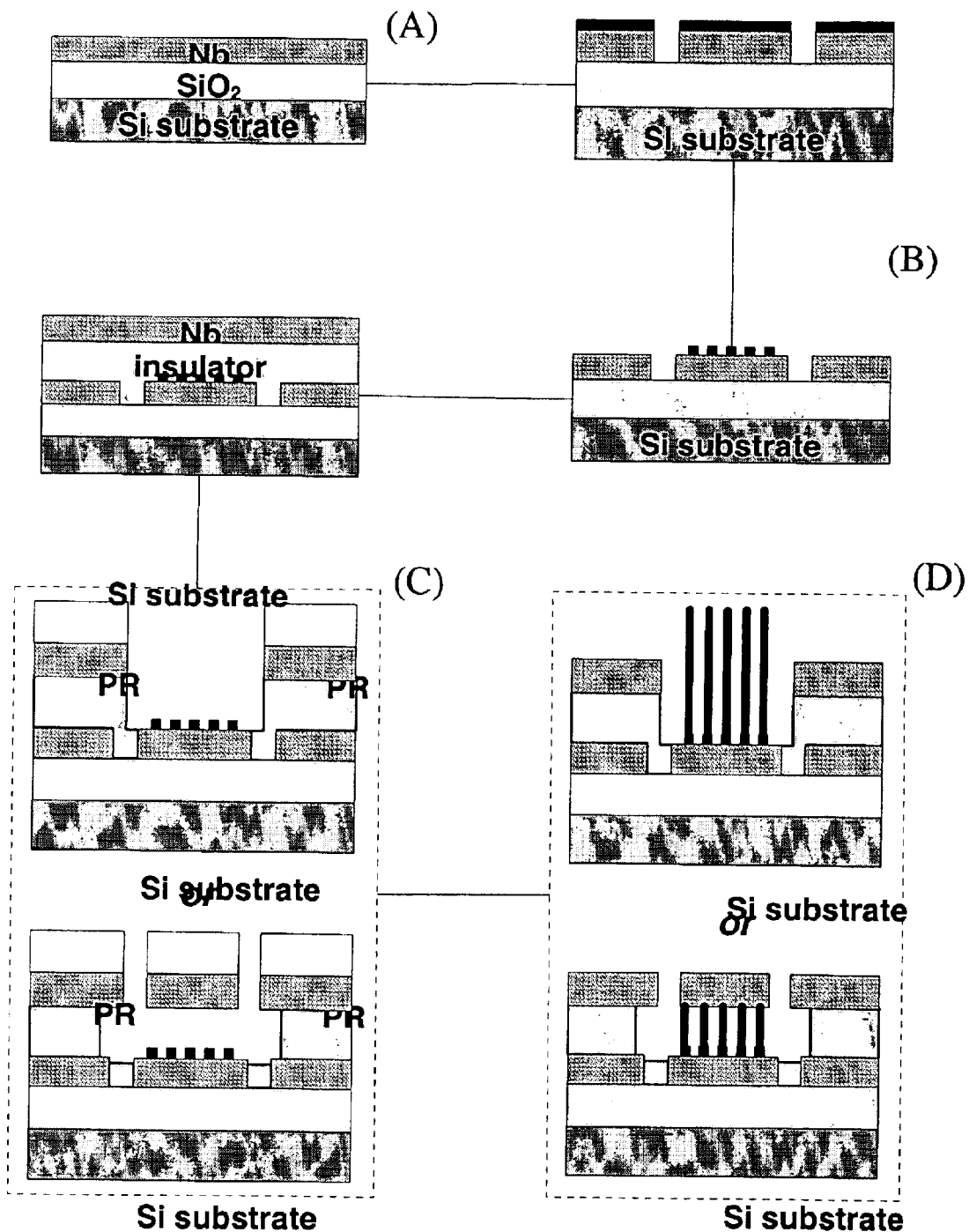
FIG. 6 is a schematic view of another embodiment of a process for forming a nanoarray RF filter according to the invention.

FIG. 6 shows an alternative process which includes the steps for forming an integrated patterned base electrode below the nanotube array. The process is similar to that of FIG. 5 except that initial processing steps are provided for deposition and patterning of a base electrode. As shown in FIG. 6(A), an insulator/refractory metal bilayer (e.g $SiO_2$/Nb) is deposited on a Si substrate. A thin catalyst layer is deposited and lithography and etching processes are used to pattern the catalyst and Nb base electrode together (step B). As an option, the catalyst layer can be further patterned by the techniques described above to form an array of catalyst dots, for example. The remainder of the process is very similar to that described above for FIG. 5. The primary difference in the completed structure of FIG. 6(D) relative to the structure of FIG. 5(D), is the existence of a patterned base electrode below the nanotube array. This configuration enables independent charge injection into the nanotube array and is the preferred embodiment of the nanotube array RF filter shown in FIG. 1a.

Further, although one method for the self-assembly of carbon nanotubes is described above, it should be understood that in order to incorporate the carbon nanotube oscillators on CMOS electronics it may be necessary to provide carbon nanotube growth at temperatures compatible with processed CMOS circuits, i.e., below about 500° C. Although any suitable method of low temperature growth may be utilized, some exemplary methods include: 1) Murikami et al. (*Appl. Phys. Lett.* 76(13), 1776 (2000)) method for growing aligned carbon nanotube arrays for field emission at <600° C. using bias-enhanced microwave plasma CVD on patterned, nickel-based catalyst at 1–3 Torr; 2) Li et al. (*Appl. Phys. Lett.*, 79(11), 1670 (2001)) method of unaligned nanotube growth on glass at 570° C. using CVD at 100 Torr; 3) low temperature processes for growing carbon nanotubes on silicon (Choi et al., *J. Vac. Sci. Technol. A*, 18(4), 1864 (2000)): using 70 nm nickel films as a catalyst deposited on silicon substrates coated with TiN as an adhesion enhancement layer) and silicon dioxide (Lee et al., *Chem. Phys. Lett.* 327, 277 (2000)) between 500–550° C.; 4) Zhang and Iijima (*Appl. Phys. Lett.*, 75(20), 3087 (1999)) method for growing single-walled carbon nanotubes at 400 C using laser ablation technique with powdered catalyst containing Ni—Co; and 5) Chen et al. (*J. Cryst. Growth*, 193, 342 (1998)) method of growing graphitic nanofibers on nickel substrates at 350–400° C. All of which are incorporated herein by reference.

While the self-assembled array resonators contemplated in the embodiments discussed so far have been constructed of arrays of carbon nanotube resonators made from pyrolizing an ethylene feedstock over a substrate having an ordered array of nucleation points, the resonators can be of any shape and made by any process and from any material suitable for making self-assembled tunable array resonators, such as, for example, spheres or pyramids made of other atomic materials or even biomolecules, such as, for example, proteins. In another embodiment, the resonators are further functionalized for a variety of applications, such as, for example, being made hydrophilic or hydrophobic, being charged either negatively or positively, or being derivatized with specific chemical groups, etc. In addition, although only an untreated carbon nanotube nanomechanical device have been shown thus far, in situ sidewall treatments could alter the electrical properties of the nanotube, such as by increasing the charge differential induced by a given applied voltage.

Finally, although the above discussion has focussed on the construction and structure of the nanotube array resonators, it should be understood that a nanomechanical device according to the invention may also include a body, a self-contained power supply, and any additional machinery or circuitry necessary for the device's operation. For example, the body of the nanomechanical device itself can be made of any material suitable for micromachining utilizing standard lithographic or MEMS techniques to enclose the nanotube array resonator, such as, for example, aluminum oxide or silicon. In a preferred embodiment, the body further comprises a cap layer, which can be of any design, such that the cap layer protects the nanotube array resonator from unwanted contact with the external environment. Such a cap layer could be made of any suitable material, such as, for example, aluminum oxide or silicon. Such a cap layer could be formed by any conventional MEMS process, such as growth or deposition over a sacrificial layer (not shown) deposited to encapsulate the self-assembled nanotube resonator array wherein the sacrificial layer can subsequently be removed to expose the self-assembled nanotube array resonator itself. Alternatively, these support structures could be formed in a single deposition step with the self-assembled nanotube array resonator. In a more preferred embodiment, one of the substrate, the cap layer, or walls of the nanomechanical device is transparent such that an optical source can be used to interrogate or activate the nanotube array resonator.

Figure 7:
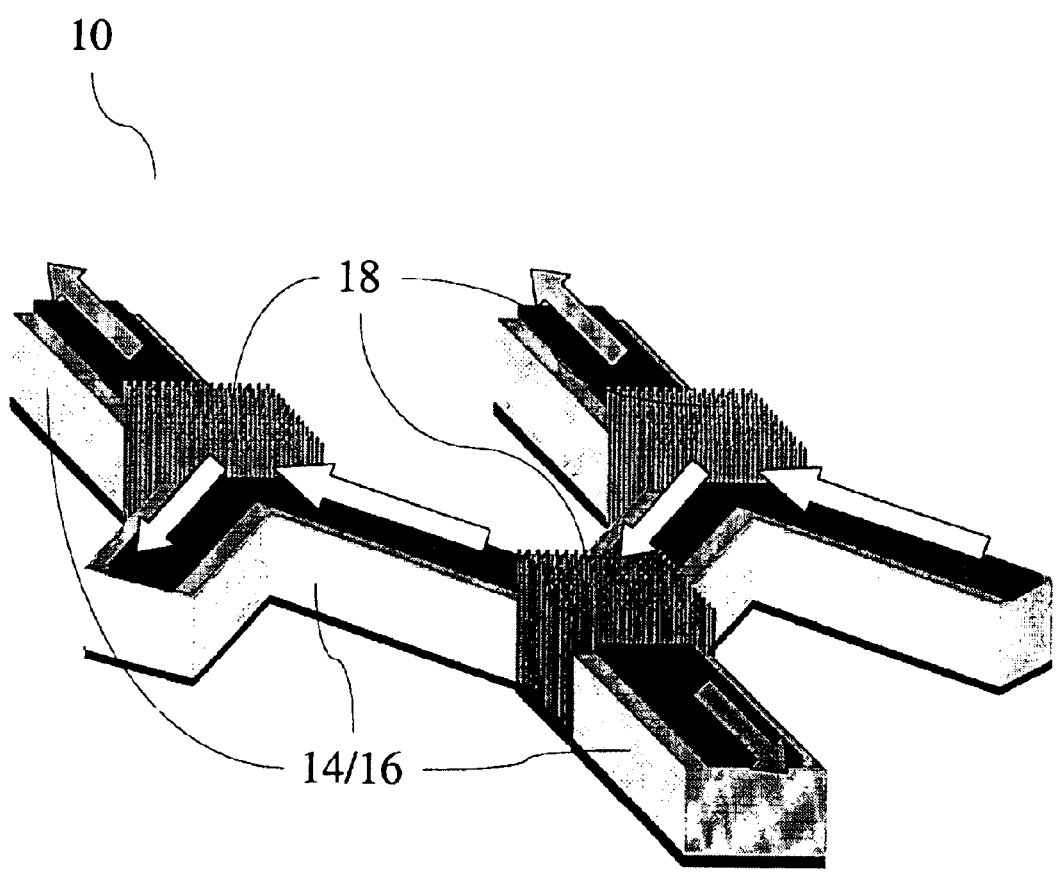
FIG. 7 is a schematic view of an embodiment of a nanoarray RF filter bank according to the invention.

In another alternative embodiment, as shown schematically in FIG. 7, the nanomechanical device may comprise a bank of nanotube array resonators aligned on a pathway of waveguides, such that multiple or parallel processing can be carried out at one time. In this embodiment, the nanotube array resonators can be integrated into a single circuit or detector, such as an RF filter bank analyzer. It should be understood that while only one configuration of multiple arrays of nanotube resonators are discussed above, any suitable alternative geometry of nanotube resonator arrays may be utilized. Further, although the arrays shown above are pictured with nanotubes having a single uniform length, each array could have a different nanotube length to select different portions of the RF signal, or alternatively, a single array could be comprised of arrays having variable length nanofeatures such that multiple frequency portions of the RF signal could be trnasmitted.

Any of the above embodiments could be used to develop a mobile nanotube array resonator detector device on a chip for mobile detection and analysis of samples. In such an embodiment a portable power source (not shown) would also be integrated into the device.

Further, although the above discussion has been directed to the actual nanotube array resonator according to the present invention, it should be understood that the invention is also directed to suitable nanomechanical devices comprising the nanofilters shown schematically in the above figures.

Although specific embodiments are disclosed herein, it is expected that persons skilled in the art can and will design alternative nanomechanical devices and methods to produce the nanomechanical devices that are within the scope of the following claims either literally or under the Doctrine of Equivalents.

What is claimed is:

1. A tunable nanofilter comprising:
    an input and an output waveguide;
    a substrate having at least one electrode disposed thereon;
    an electrode power source for producing an electrode bias in signal communication with the electrode; and
    at least one ordered array of a plurality of mechanically resonating members, wherein at least one portion of each of the resonating members is fixedly attached to the substrate and in contact with the electrode and at least one portion of each of the resonating members is free to oscillate at a resonant frequency, the array being in signal communication with the electrode such that an electrode bias applied to the resonating members of the array alters the resonant frequency of the resonating members of the array, the array in further signal communication with the input and output waveguides such that an RF bias applied to the input waveguide is conducted to the array such that an RF bias having a resonant frequency compatible with the mechanical resonant frequency of the array is conducted to the output waveguide, while an RF bias having a resonant frequency incompatible with the mechanical resonant frequency of the array is blocked.

2. The tunable nanofilter according to claim 1 wherein the substrate is made of a material selected from the group consisting of silicon, alumina, glass or sapphire.

3. The tunable nanofilter according to claim 1 wherein the array is capacitively coupled to the input and output waveguides.

4. The tunable nanofilter according to claim 1 wherein the electrode is made of a metal selected from the group consisting of gold, platinum and titanium.

5. The tunable nanofilter according to claim 1 wherein the substrate further comprises a plurality of support structures designed to provide directional guidance to the resonating members, and wherein the resonating members are fixedly attached to a separate one of the plurality of the support structures at one point.

6. The tunable nanofilter according to claim 1 wherein the substrate further comprises a plurality of catalytic spots deposited thereon wherein the resonating members are fixedly attached to the substrate through a catalytic spot.

7. The tunable nanofilter according to claim 6 wherein the catalytic material is selected from the group consisting of Fe, Ti, Ni, Mo, Co, Ni/Co alloy, and Ni/Ti alloy.

8. The tunable nanofilter according to claim 1 wherein the electrode power source is selected from the group consisting of: a voltage source, a current source, and a light source.

9. The tunable nanofilter according to claim 1 wherein the array is made of a plurality of resonating members having uniform cross-section and length.

10. The tunable nanofilter according to claim 1 wherein the resonating members have a cross-sectional dimension of about 1 to 100 nm.

11. The tunable nanofilter according to claim 1 wherein the space between the resonating members has a dimension of about 10 to 200 nm.

12. The tunable nanofilter according to claim 1 wherein the device operates as an RF filter.

13. The tunable nanofilter according to claim 1 wherein the resonating members are attached at one end to the electrode.

14. The tunable nanofilter according to claim 1 wherein the device is selected from the group consisting of:
    an electronic filter and a signal processor.

15. The tunable nanofilter according to claim 1 wherein each of the at least one electrode comprises two oppositely biased electrodes.

16. The tunable nanofilter according to claim 1 wherein the resonating member, have varying lengths.

17. The tunable nanofilter according to claim 1 wherein the resonating members are made of carbon.

18. The tunable nanofilter according to claim 1 wherein the resonating members are grown by self-assembly on the electrode.

19. The tunable nanofilter according to claim 1 wherein the resonating members are one of either nanotubes or nanorods.

20. The tunable nanofilter according to claim 1 wherein the resonating members are chemically or biologically functionalized.

21. The tunable nanofilter according to claim 1 wherein the outer surface of the resonating members are treated to increase the resistance of the resonating members.

22. The tunable nanofilter according to claim 1, further comprising a device body defining an internal volume wherein the array of resonating members is confined within the internal volume.

23. The tunable nanofilter according to claim 22, wherein the device body is transparent.

24. The tunable nanofilter according to claim 22 wherein the device body is made of a material selected from the group consisting of silicon, alumina, glass and sapphire.

25. The tunable nanofilter according to claim 1 wherein the oscillation of the resonating member is proportional to the electrode bias potential applied to the resonating member.

26. The tunable nanofilter according to claim 1 wherein the motion induced output signal of the resonating member is proportional to the degree of motion of the resonating member.

27. The tunable nanofilter according to claim 1 wherein the device is disposed in a liquid environment.

28. The tunable nanofilter according to claim 1 wherein the device is disposed in a vacuum environment.

29. The tunable nanofilter according to claim 1 wherein the device is disposed in a gaseous environment.

30. The tunable nanofilter according to claim 1 having a single array comprising a plurality of resonating members having at least two different resonant frequencies.

31. The tunable nanofilter according to claim 1 comprising at least two arrays of resonating members wherein each array comprises a plurality of resonating members having a single resonant frequency.

32. The tunable nanofilter according to claim 1 comprising at least two arrays of resonating members wherein each array comprises a plurality of resonating members and wherein each set of resonating members has a different resonant frequency.

33. The tunable nanofilter according to claim 1 comprising at least two arrays of resonating members wherein each array comprises a plurality of resonating members having at least two resonant frequencies.

34. The tunable nanofilter according to claim 1 wherein the resonating members are either vertically or horizontally oriented.

35. The tunable nanofilter according to claim 1 wherein the substrate has an area of about 0.1 mm$^2$ to 1 cm$^2$.

36. The tunable nanofilter according to claim 1 wherein the ordered array is uniformly spaced.

37. The tunable nanofilter according to claim 1 wherein the plurality of nanofeatures are of a uniform size.

38. A tunable nanofilter comprising:
   an input and an output waveguide;
   at least one electrode;
   at least one electrode power source for producing an electrode bias in signal communication with the at least one electrode; and
   at least one ordered array of a plurality of mechanically resonating members, wherein at least one portion of each of the resonating members is fixedly attached to the electrode and at least one portion of each of the resonating members is free to oscillate at a resonant frequency such that the array includes resonating members having at least two different resonant frequencies, the array being in signal communication with the electrode such that an electrode bias applied to the resonating members of the array alters the resonant frequencies of the resonating members of the array, the array in further signal communication with the input and output waveguides such that an RF bias applied to the input waveguide is conducted to the array such that an RF bias having a resonant frequency compatible with the mechanical resonant frequencies of the array is conducted to the output waveguide, while an RF bias having a resonant frequency incompatible with the mechanical resonant frequencies of the array is blocked.

39. The tunable nanofilter according to claim 38 wherein the ordered array is uniformly spaced.

40. The tunable nanofilter according to claim 38 wherein the plurality of nanofeatures are of a uniform size.

41. The tunable nanofilter according to claim 38 wherein each of the at least one electrode comprises two oppositely biased electrodes.

42. A tunable nanofilter comprising:
   at least two sets of input and output waveguides;
   at least two electrodes;
   at least one electrode power source for producing an electrode bias in signal communication with the at least two electrodes; and
   at least two ordered arrays of a plurality of mechanically resonating members, the arrays being constructed such that at least one portion of each of the resonating members on each of the at least two uniformly spaced arrays is fixedly attached to a corresponding one of the at least two electrodes and at least one portion of each of the resonating members is free to oscillate at a resonant frequency, each of the arrays being in signal communication with a corresponding one of the at least two electrodes such that an electrode bias applied to the resonating members of the corresponding array alters the resonant frequency of the resonating members of the corresponding array, each of the arrays in further signal communication with a corresponding one set of the at least two input and output waveguides such that an RF bias applied to the corresponding input waveguide is conducted to the corresponding array such that an RF bias having a resonant frequency compatible with the mechanical resonant frequency of the corresponding array is conducted to the corresponding output waveguide, while an RF bias having a resonant frequency incompatible with the mechanical resonant frequency of the corresponding array is blocked, the at least two arrays being further constructed such that the resonating members of each array have a different mechanical resonant frequency; and
   wherein the output waveguide of one of the at least two arrays is in signal communication with at least the input waveguide of a second of the at least two arrays.

43. The tunable nanofilter according to claim 42 wherein the output waveguide of the one of the at least two arrays and the input waveguide of the second of the at least two array in signal communication comprise a single interconnecting waveguide.

44. The tunable nanofilter according to claim 42 wherein the ordered array is uniformly spaced.

45. The tunable nanofilter according to claim 42 wherein the plurality of nanofeatures are of a uniform size.

46. The tunable nanofilter according to claim 42 wherein each of the at least two electrodes comprises two oppositely biased electrodes.

47. A method of filtering a frequency signal comprising the steps of:
   providing at least one nanofilter including at least one electrode, an electrode power source for producing an electrode bias to the electrode, an input and an output waveguide, end at least one array of mechanically resonating members, wherein at least one portion of each of the resonating members is fixedly attached to the electrode and at least one portion of each of the resonating members is free to oscillate at a resonant frequency, the array in signal communication with the electrode such that an electrode bias applied to the array alters the resonant frequency of the resonating members of the array, the array in further signal communication with the waveguides such that an RF bias applied to the input waveguide is conducted to the array such that an RF bias having a resonant frequency compatible with the mechanical resonant frequency of the array is conducted to the output waveguide, while an RF bias having a resonant frequency incompatible with the mechanical resonant frequency of the array is blocked; and
   placing the input waveguide into proximity of the frequency signal comprising at least one RF bias such that the frequency signal is conducted to the array.

48. The method according to claim 47 wherein the electrode bias potential is proportional to the motion of the resonating member.

49. The method according to claim 47 wherein each resonating member is a nanotube.

50. The method according to claim 49 wherein the method comprises providing at least two arrays of resonating members having different resonant frequencies.

51. The tunable nanofilter according to claim 47 wherein the array is uniformly spaced.

52. The tunable nanofilter according to claim 47 wherein the plurality of nanofeatures are of a uniform size.

53. The tunable nanofilter according to claim 47 wherein each of the at least one electrode comprises two oppositely biased electrodes.

* * * * *